(12) United States Patent
Haug

(10) Patent No.: US 8,050,016 B2
(45) Date of Patent: Nov. 1, 2011

(54) CONTROL DEVICE PARTICULARLY REMOTE CONTROL FOR INDUSTRIAL APPLIANCES

(76) Inventor: Thomas Haug, Birkenfeld (DE)

( * ) Notice: Subject to any disclaimer, the term of this patent is extended or adjusted under 35 U.S.C. 154(b) by 273 days.

(21) Appl. No.: 12/514,225

(22) PCT Filed: Nov. 6, 2007

(86) PCT No.: PCT/DE2007/001987
§ 371 (c)(1),
(2), (4) Date: May 8, 2009

(87) PCT Pub. No.: WO2008/055480
PCT Pub. Date: May 15, 2008

(65) Prior Publication Data
US 2010/0110620 A1    May 6, 2010

(30) Foreign Application Priority Data
Nov. 9, 2006    (DE) .................... 20 2006 017 127 U

(51) Int. Cl.
*G06F 1/16*    (2006.01)
*H05K 7/02*    (2006.01)
(52) U.S. Cl. ................................. 361/679.01
(58) Field of Classification Search .............. 361/679.01
See application file for complete search history.

(56) References Cited

U.S. PATENT DOCUMENTS

| 6,134,102 | A * | 10/2000 | Worn et al. ................. 361/679.3 |
| 6,184,804 | B1 * | 2/2001 | Harrison .......................... 341/22 |
| 6,522,949 | B1 * | 2/2003 | Ikeda et al. .................... 700/245 |
| 6,734,842 | B2 * | 5/2004 | Woodmansee et al. ........ 345/169 |
| 7,164,971 | B2 * | 1/2007 | Ferla et al. ..................... 700/264 |
| 7,177,724 | B2 * | 2/2007 | Cantello et al. ............... 700/264 |
| 7,269,030 | B2 * | 9/2007 | Miller et al. .................... 361/797 |
| 7,400,348 | B2 * | 7/2008 | Hoyos ....................... 348/211.99 |
| D577,724 | S * | 9/2008 | Henne .......................... D14/401 |
| 7,586,037 | B2 * | 9/2009 | Parker et al. .................... 174/50 |
| 2004/0240161 | A1 * | 12/2004 | Miller et al. ................... 361/679 |

FOREIGN PATENT DOCUMENTS

| EP | 1 683 753 A1 | 7/2006 |
| FR | 2595852 A1 | 9/1987 |
| WO | 03/064311 A1 | 8/2003 |
| WO | 2005/033822 A1 | 4/2005 |

OTHER PUBLICATIONS

International Search Report in application PCT/DE2007/001987 dated Apr. 3, 2008.

* cited by examiner

*Primary Examiner* — Lisa Lea Edmonds
(74) *Attorney, Agent, or Firm* — Browdy and Neimark, PLLC

(57) ABSTRACT

Disclosed is a control device, particularly a remote control for industrial appliances, comprising a housing for accommodating the control electronics and at least one control element. The housing (10) is formed by a wall part (11) and holding elements (13, 14) which close the two faces of the wall part (11) and can be interconnected by means of bars (17, 18, 19). Preferably the holding elements are molded plastic parts while the wall part (11) and/or the bars (17, 18, 19) are profiled metal parts. The housing can thus be assembled from simple components, i.e. a wall part and holding elements that close the faces, as basic modules which can be expanded in many different ways, allowing an individually configured control device to be designed like a module or kit. Various requirement levels regarding mechanical stability, durability, service life, production costs, etc. can be met by adequately selecting the materials.

44 Claims, 9 Drawing Sheets

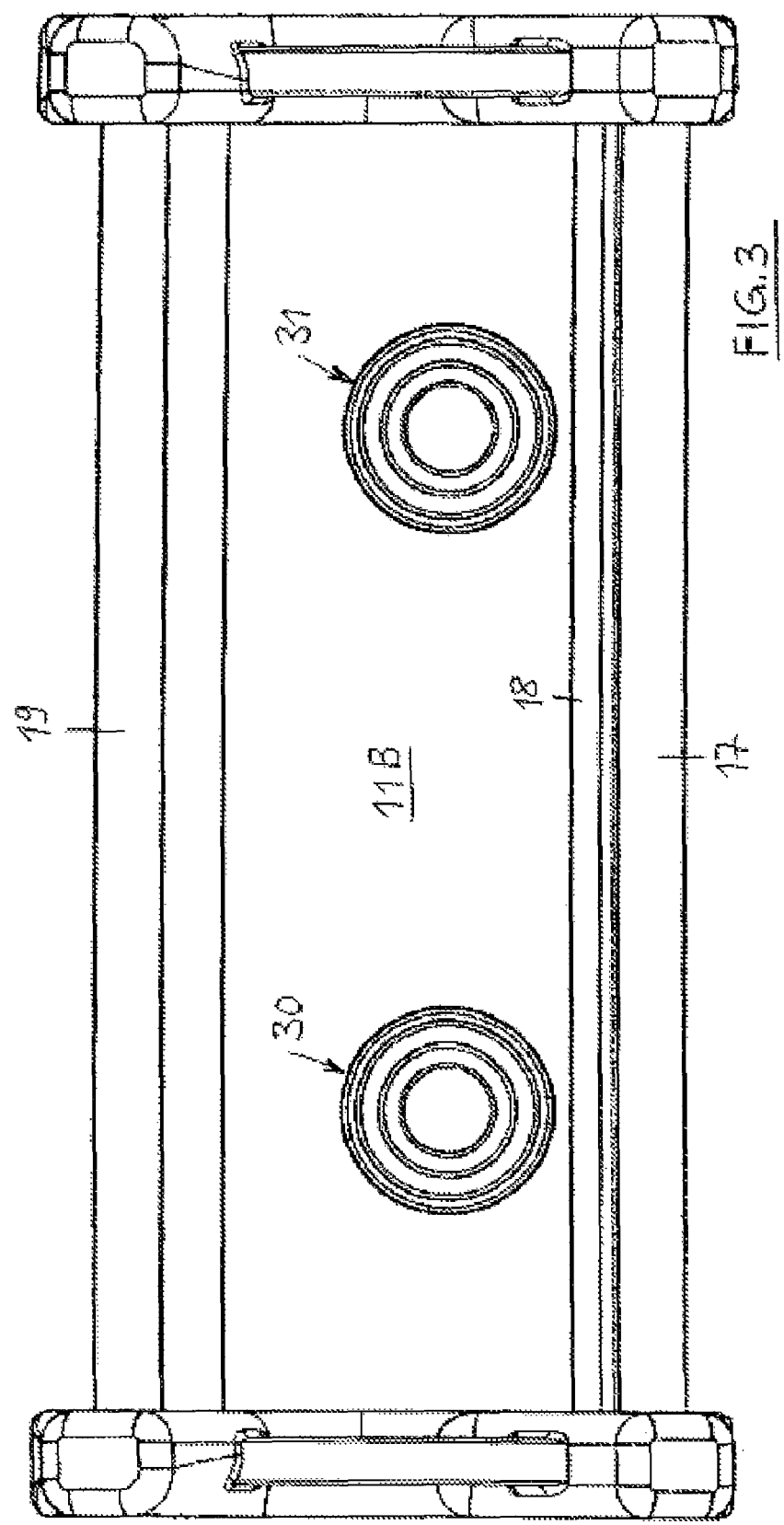

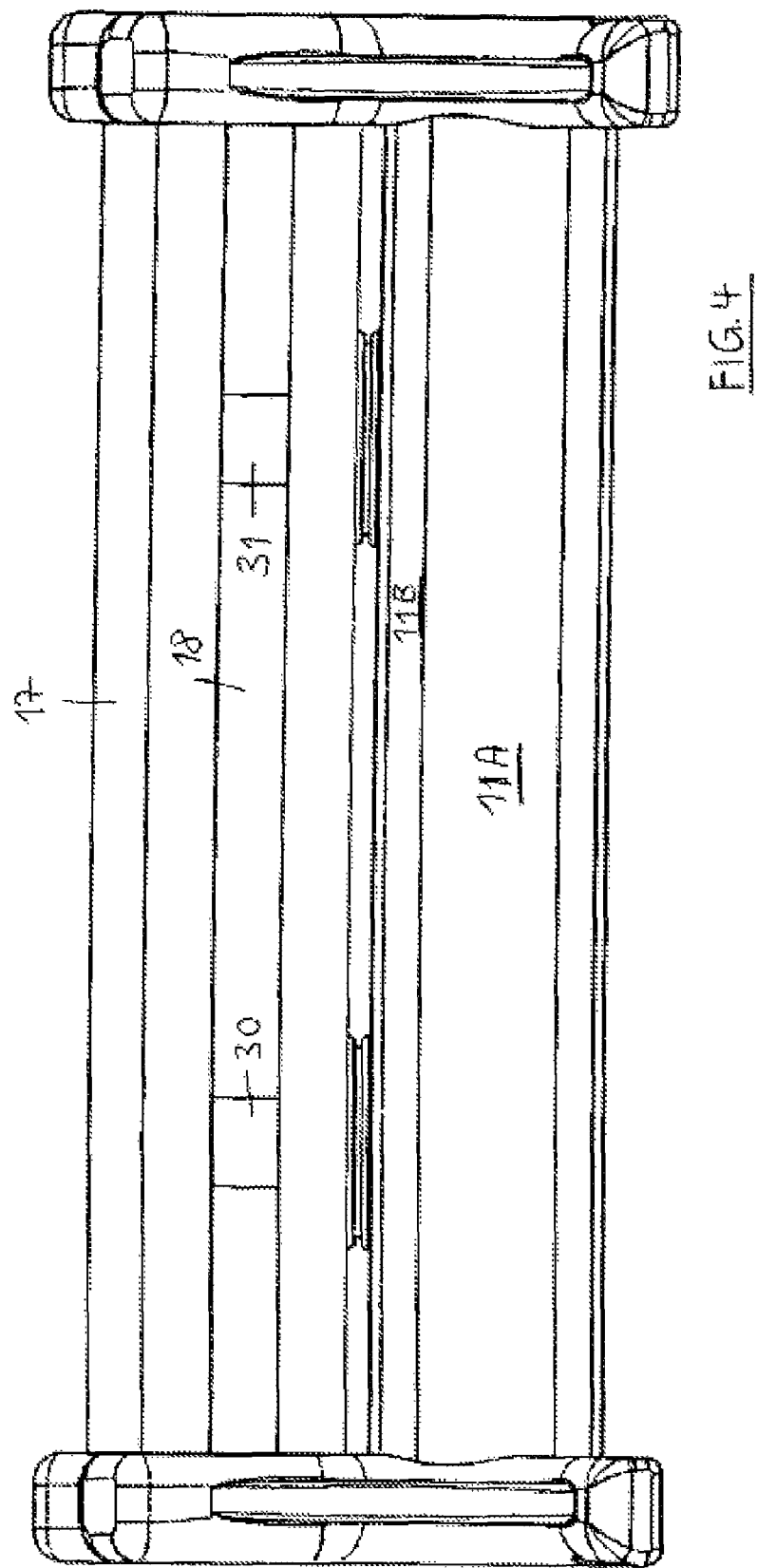

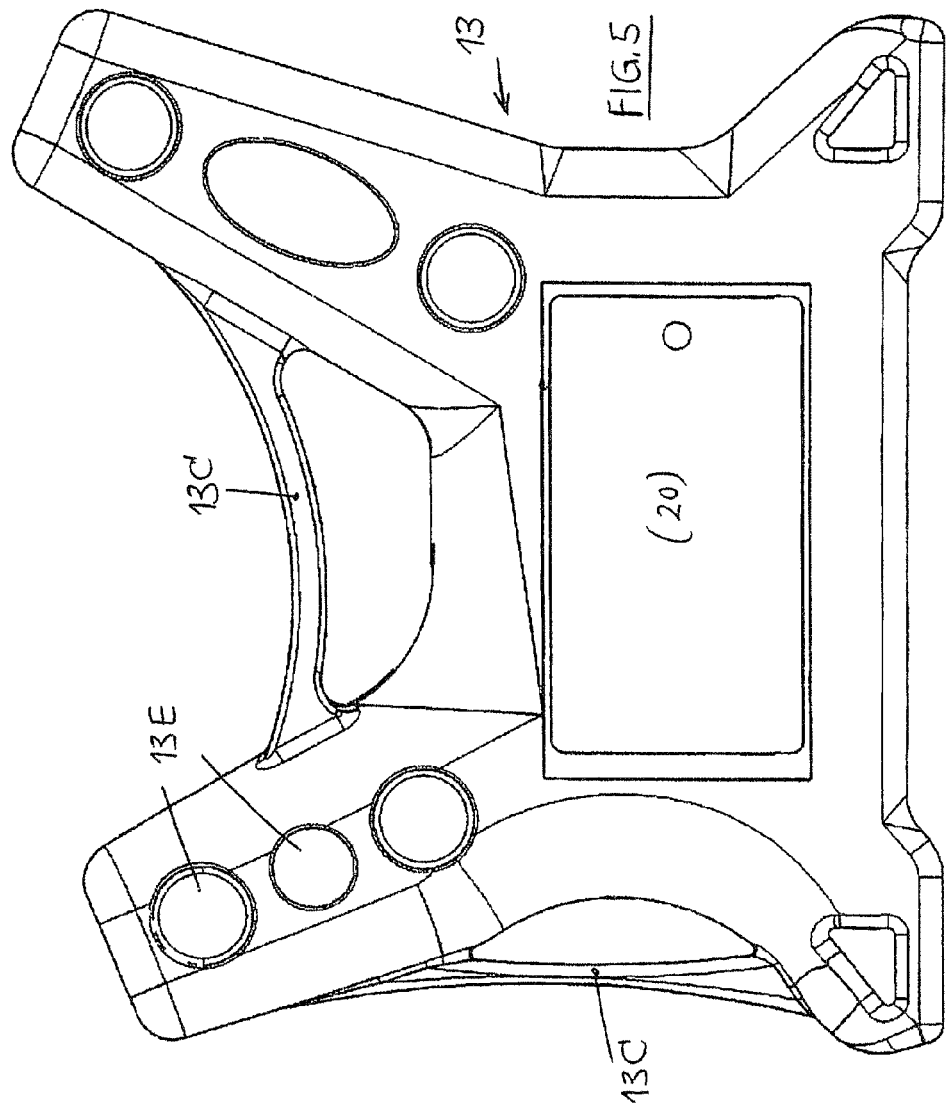

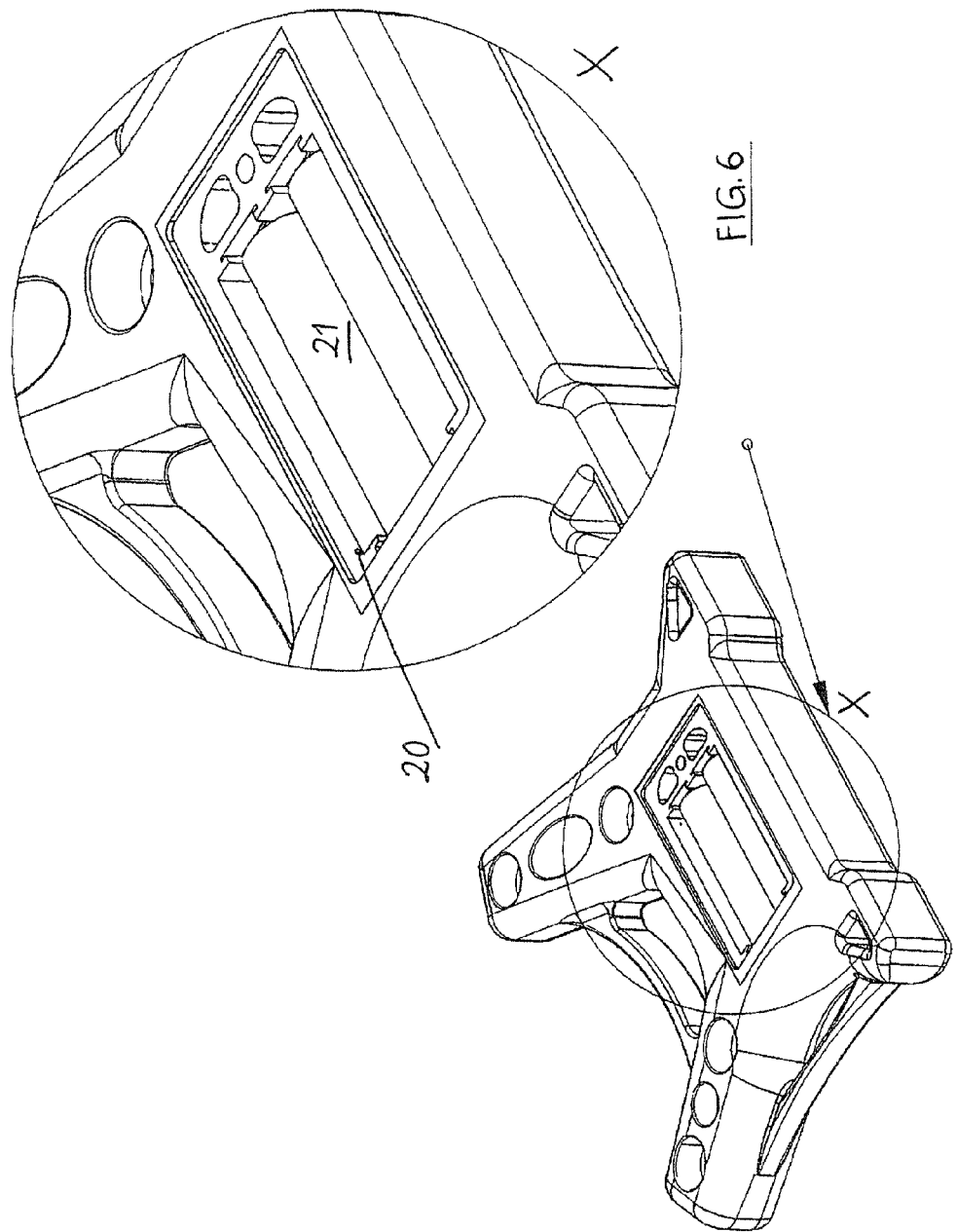

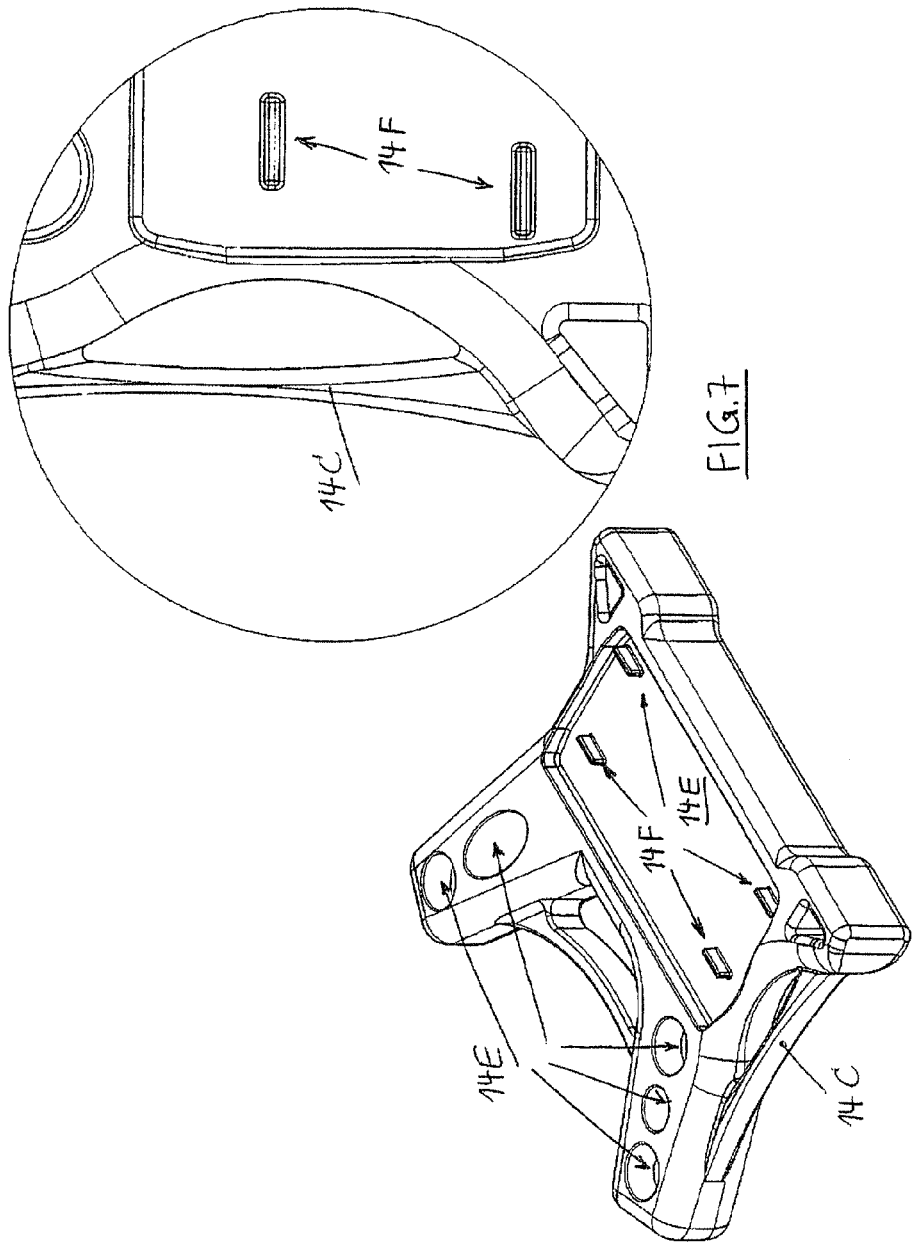

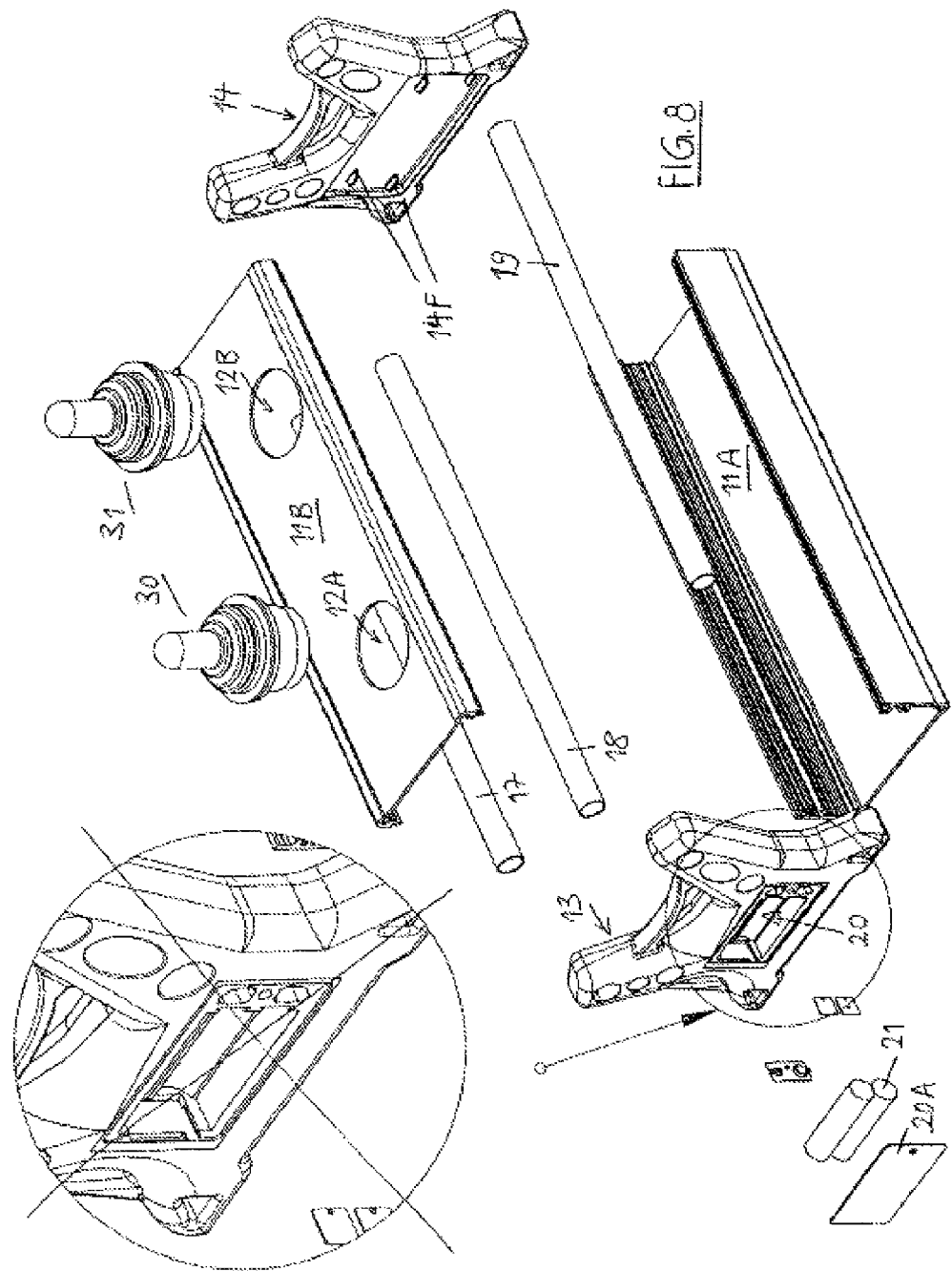

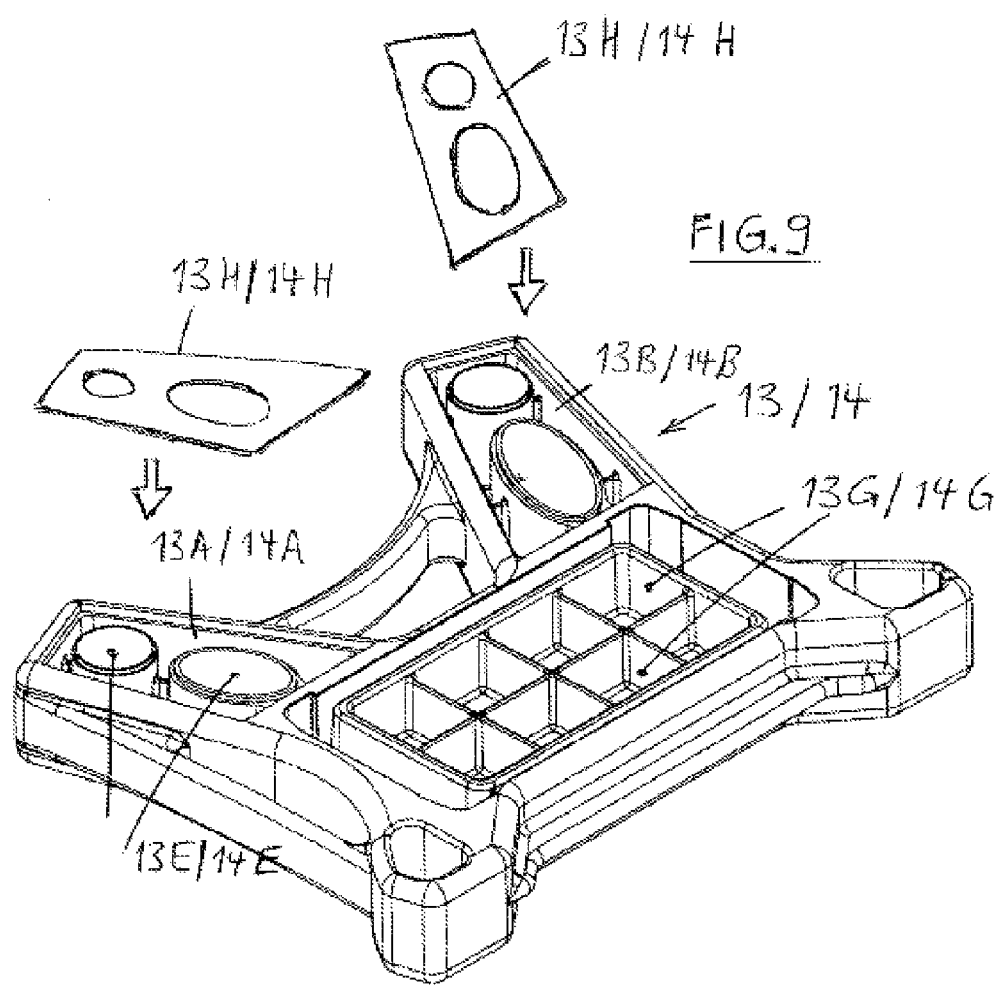

CONTROL DEVICE PARTICULARLY REMOTE CONTROL FOR INDUSTRIAL APPLIANCES

TECHNICAL BACKGROUND

The present invention relates to a control unit, particularly a remote control for industrial equipment, comprising a housing for accommodating the control electronics and at least one control element.

Control units of this type have been in use for years and they are employed, for example, for the remote control of cranes on construction sites. The housing is usually a box-like object that is held either directly by the hands of the user, or via a carrying strap with the aid of which the control unit is held in front of the body of the operator, who then has his hands free to operate, for example, two joysticks.

Control units of this type exist in a whole variety of technical designs and styles, which accordingly necessitates individual production measures.

DISCLOSURE OF THE INVENTION

It is the object of the present invention to design a control unit of the generic type in such a way that it can be manufactured from simple basic components in variable dimensions in simple processing steps.

It is another object of the invention that the housing that is designed in this manner can easily be expanded with additional components that have additional functionality in adaptation to the intended use and/or to the employed control elements, such as e.g. joysticks. The goal is, therefore, for the control unit to be configurable from standard components as individually as possible.

This object is achieved according to the present invention with the characteristics of claim 1.

The underlying concept of the invention accordingly is that the housing is composed of simple components, namely a wall part and holding elements that close the end faces, as "base modules" that can be expanded according to advantageous embodiments, which are specified in the subclaims, in many different ways so that an individually configured control unit is obtained that is designed module-like or building-block-like.

Various requirement levels regarding mechanical stability, durability, service life, production costs, etc., can be met by selecting the proper materials, and the individual configuration can thus largely be completed "off the storage rack".

BRIEF DESCRIPTION OF THE DRAWINGS

A preferred exemplary embodiment of the control unit will now be explained in greater detail based on an industrial remote control unit, with drawings as follows:

FIG. 3 is a top view,
FIG. 4 is a side view,
FIG. 5 is a front view,
FIG. 6 is a perspective detail view of the end face of a holding element,
FIG. 7 is a perspective detail view of the inside of a holding element,
and
FIG. 8 is an exploded view of the control unit with its components,
and
FIG. 9 is a variant of a holding element.

DESCRIPTION OF AN EXEMPLARY EMBODIMENT

Figure 1:
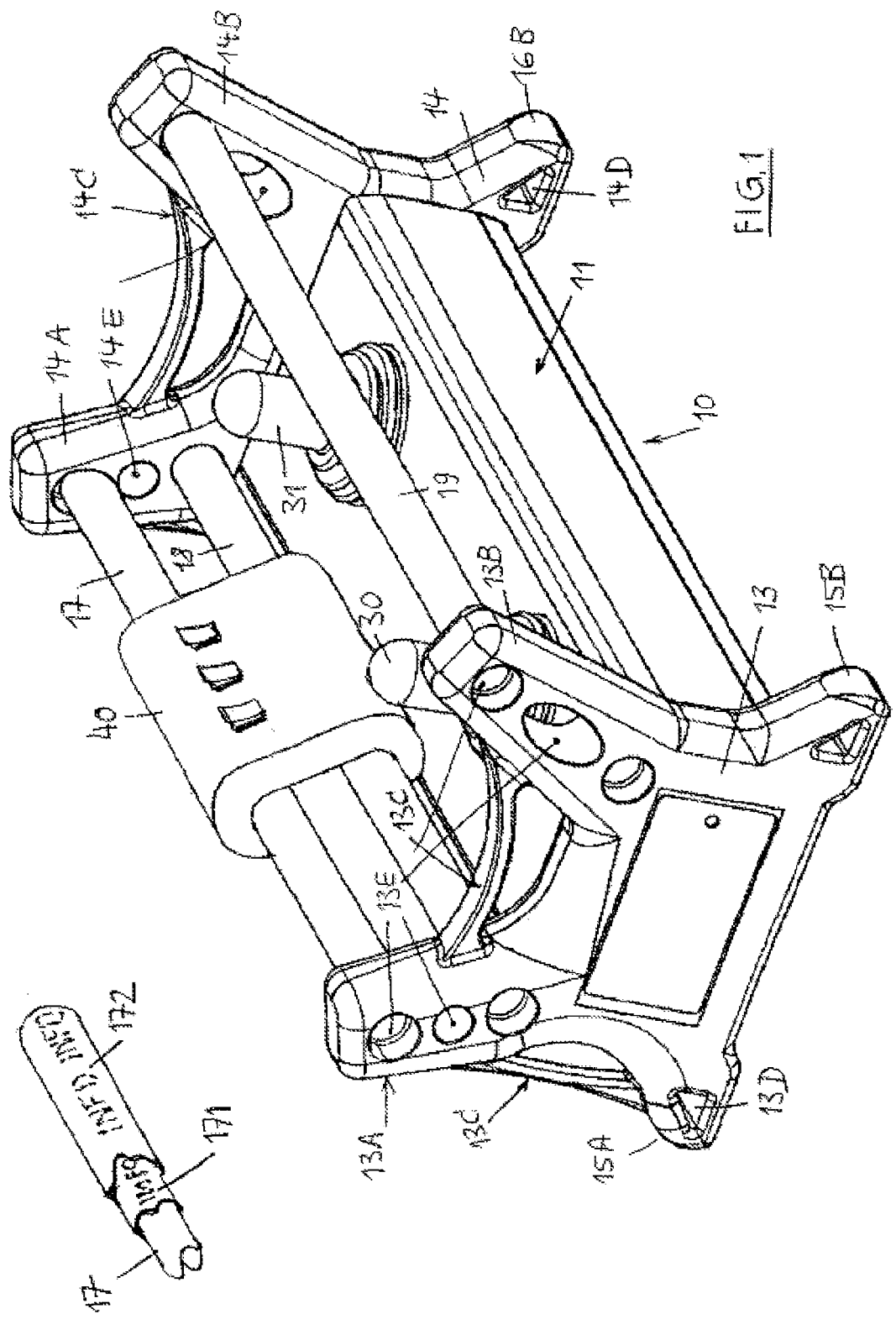
FIG. 1 is a perspective general view from above.

The control unit consists of only a few components, which are shown in the exploded view of FIG. 8:

The housing 10 consists of a cuboid wall part 11 that is composed of a bottom, U-shaped component 11A and a top, cover-like component 11B, which are horizontally connectable to one another, for example via pressing or pushing in appropriate corresponding contourings of their upper edge regions. The top component 11B has circular cutouts 12A, 12B for insertion of two control elements 30,31 that are shown in the exemplary embodiment in the form of joysticks. Contained within the housing are the usual electronic components, for example for a remote control transmitter; these are commonly known and are not depicted for ease of viewing.

The two components 11A,11B that form the wall part 11 are cut to the desired length from profiled bars and provided with the desired number of openings 12A,12B, so as to be able to hold the desired type and number of control elements.

The wall part 11 that is individually designed in this manner is closed at its open end faces with a holding element 13,14 in each case, which is provided for this purpose on its inside that face the wall part 11 with corresponding recesses, grooves, projections or contourings 14F, so as to allow a fixed relation of the wall part and holding element to one another. The holding elements 13, 14 can be produced as one-piece molded plastic parts via injection molding batch runs and are designed approximately X-shaped as viewed from the top, with two arms 13A,13B,14A,14B in each case facing in the direction of the control elements 30,31 and, opposite the same, feet 15A,15B,16A,16B.

The arms 13A,13B,14A,14B are dimensioned such that the plane that extends across their top ends extends above the control elements 30,31, so that these are protected, i.e. even in cases of unintentional movements of the control unit, jolts or other external influences are always reliably absorbed by at least one of the arms of a holding element. One essential function of the thusly designed holding elements accordingly consists of protecting the control elements.

Figure 2:
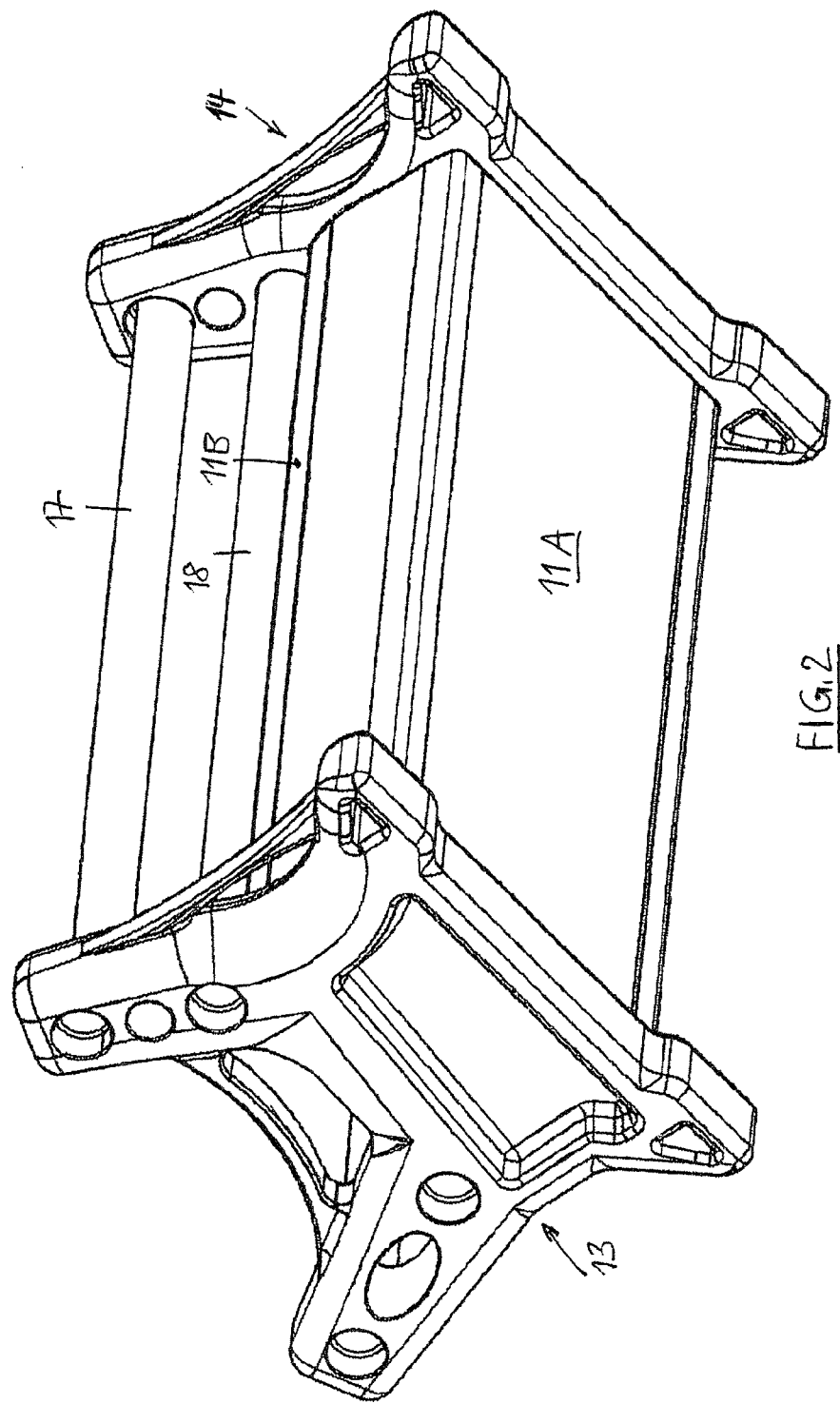
FIG. 2 is a perspective general view from below.

The arms 13A,13B,14A,14B have a plurality of stacked recesses 13E,14E, into which three bars 17,18,19 can be inserted in the shown exemplary embodiment whose length is slightly greater than the length of the wall part 11, so that a structure is created as it is shown in FIGS. 1 through 4. The bars may be made of a variety of materials, depending on the desired appearance or mechanical stability; they may be positioned at various heights by insertion into the different recesses 13E,14E, so that they can serve, for example, as added protection for the control elements, or also so that they serve as a single or additional hand support, or so that they are supported in a suitable manner on the operator's body.

One or more of these bars may also accommodate electronic components, such as antenna arms, for example, which are then routed via one arm of a holding element into the wall part 11 and connected to the electronics that are housed there.

Between the bars 17 and 18, or also between the bar 19 and the edge of the wall part 11, there may be supported a plastic part 40 that contains additional control elements or displays.

A further embodiment provides that there is disposed in one of the holding parts 13,14 a receptacle 20 in the form of a well that is designed and dimensioned such that power supply components 21, such as, for example, batteries or rechargeable battery packs may be placed therein that supply power to the electronic components inside the wall part 11.

The receptacle 20 with the power supply components 21 placed therein may be closed with a cover 20A.

The holding parts 13,14 are additionally shaped such that they contain holding means 13C,14C whereby the control unit can be carried also without a strap; however, straps also may be inserted through the openings formed by them.

A preferred embodiment of a holding part 13,14 is shown in FIG. 9:

The component is produced in the form of a hollow part, in which webs 13G,14G effect a division into compartments that may serve for accommodation of electronic components or also of an antenna. These webs and walls then also form suitable contourings for a fixed securing and positioning of a wall part 11. The arms 13A,13B,14A,14B are closed by means of cover plates 13H,14H with openings that leave the recesses 13E,14E open.

The feet 15A,15B,16A,16B provide for a secure stand of the control unit on one hand but, on the other hand, protect the wall part itself and the control elements from damage in the event of jolts or drops.

LIST OF REFERENCE NUMERALS

Housing 10
Wall part 11
Components 11A,11B
Openings 12A,12B
Holding elements 13,14
Arms 13A,13B,14A,14B
Holding means 13C,14C
Cutouts 13D,14D
Recesses 13E,14E
Webs 13G,14G
Cover plates 13H,14H
Projections 14F
Feet 15A,15B,16A,16B
Bars 17,18,19
Receptacle 20
Cover 20A
Power supply components 21
Control elements 30,31
Plastic part 40

What is claimed is:

1. A control unit, particularly a remote control for industrial equipment, comprising a housing for accommodating control electronics and at least one control element,
wherein the housing (10) is formed by a wall part (11) having two end faces and holding elements (13,14) that close the two end faces of the wall parts, and the wall part consists of two horizontally connectable components.

2. A control unit as set forth in claim 1, wherein the wall part (11) has a substantially rectangular cross section.

3. A control unit as set forth in claim 1, wherein the wall part (11) consists of at least one metal profile.

4. A control unit as set forth in claim 1, wherein the wall part (11) consists of at least one plastic profile.

5. A control unit as set forth in claim 1, wherein the wall part (10) has openings (12A,12B) for accommodating control elements (30,31).

6. A control unit as set forth in claim 1, wherein the holding elements (13,14) are molded plastic parts.

7. A control unit as set forth in claim 1, wherein the holding elements (13,14) have contourings composed of channels, grooves or projections (14F) for connection to the wall part (11).

8. A control unit, particularly a remote control for industrial equipment, comprising a housing for accommodating control electronics and at least one control element, wherein the housing (10) is formed by a wall part (11) having two end faces and holding elements (13,14) that close the two end faces of the wall parts, wherein the holding elements (13,14) have two arms (13A,13B,14A,14B) facing in the direction of the control elements, situated in a plane perpendicular to the wall part (11).

9. A control unit as set forth in claim 1, wherein the holding elements (13,14) have a support surface for the hands.

10. A control unit as set forth in claim 8, wherein the arms (13A,13B,14A,14B) have cutouts (13D,14D) for holding straps or carrying straps.

11. A control unit as set forth in claim 8, wherein the two arms of a holding element (13A,13B;14A,14B) are arranged V-shaped with respect to each another.

12. A control unit as set forth in claim 8, wherein the plane between the upper ends of the four arms (13A,13B; 14A,14B) extends above the control elements.

13. A control unit as set forth in claim 1, wherein the holding elements (13,14) have at least one holding means (13C,14C) for the fingers that permit the control unit to be carried without straps as well.

14. A control unit as set forth in claim 8, wherein the holding elements (13,14) have feet (15A,15B,16A,16B) situated opposite the arms (13A,13B,14A,14B).

15. A control unit as set forth in claim 8, wherein the opposed arms (13A,14A;13B,14B) of the two holding elements (13,14) are connected to one another via bars (17,18, 19).

16. A control unit as set forth in claim 15, wherein the bars (17,18) are selectively insertable into a plurality of recesses (13E,14E) within the holding elements (13,14).

17. A control unit as set forth in claim 15, wherein the bars (17,18,19) are made of metal.

18. A control unit as set forth in claim 15, wherein the bars (17,18,19) are made of plastic or glass fiber.

19. A control unit as set forth in claim 17, wherein at least one of the wall part (11) and each of the bars (17,18,19) is a metal profile.

20. A control unit as set forth in 18, wherein at least one of the wall part (11) and each of the bars (17,18,19) is a plastic profile.

21. A control unit as set forth in claim 17, wherein at least one of the wall part (11) and each of the bars (17,18,19) is an extruded profile.

22. A control unit as set forth in claim 1, wherein the wall part (11) consists of at least one profile.

23. A control unit as set forth in claim 1, wherein the holding elements (13,14) have at least one receptacle (20) for power supply components (20A) that include a battery or rechargeable battery pack.

24. A control unit as set forth in claim 1, wherein the holding elements (13,14) have receptacles for additional control elements.

25. A control unit as set forth in claim 1, wherein the holding elements (13,14) are designed as one-piece units.

26. A control unit as set forth in claim 1, wherein the holding elements have an inside and an outside that are identical.

27. A control unit as set forth in claim 15, wherein there is disposed between the wall part (11) and one of the bars (17, 18, 19) a plastic part (40) that contains electronic components.

28. A control unit as set forth in claim 27, wherein the plastic part (40) houses at least one of: an antenna, a portion of an antenna, and the antenna lead-in.

29. A control unit as set forth in claim 28, wherein at least one of the bars is made of plastic and the lead-in leads to an antenna rod housed inside the plastic bar.

30. A control unit as set forth in claim 18, wherein one of the bars houses an antenna.

31. A control unit as set forth in claim 17, wherein one of the bars is an antenna.

32. A control unit as set forth in claim 31, wherein the metal bar is electrically isolated.

33. A control unit as set forth in claim 32, wherein the isolation is implemented by means of a plastic material or an additional conduit.

34. A control unit as set forth in claim 33, wherein the isolation is implemented by means of a coating (lacquer).

35. A control unit as set forth in claim 27, wherein the plastic part (40) contains control elements.

36. A control unit as set forth in claim 27, wherein the plastic part (40) contains at least one display.

37. A control unit as set forth in claim 27, wherein the plastic part (40) contains at least one LED.

38. A control unit as set forth in claim 1, wherein the holding elements (13,14) consist of a tub-like hollow part that is divided into compartments by means of webs (13G,14G).

39. A control unit as set forth in claim 38, wherein the top side of the hollow part is at least partially closed by means of cover plates (13H,14H).

40. A control unit as set forth in claim 38, wherein at least one of the compartments of a holding element (13,14) houses electronic components and/or an antenna.

41. A control unit as set forth in claim 15, wherein at least one of the bars (17,18,19) is provided with an information carrier for operation of the at least one control unit.

42. A control unit as set forth in claim 41, wherein the information carrier is a foil (171) that covers the circumference of the bar (17) at least partially.

43. A control unit as set forth in claim 42, wherein the foil (171) is enclosed by an at least partly transparent protective film (172) that is preferably shrunk onto the bar (17).

44. A control unit as set forth in claim 5, wherein the control elements comprise at least one of a joystick, a display, and LEDs.

* * * * *